United States Patent
Kroeckel

(10) Patent No.: US 7,266,406 B2
(45) Date of Patent: Sep. 4, 2007

(54) MAGNETIC RESONANCE APPARATUS

(75) Inventor: Horst Kroeckel, Bamberg (DE)

(73) Assignee: Siemens Aktiengesellschaft, Munich (DE)

( * ) Notice: Subject to any disclaimer, the term of this patent is extended or adjusted under 35 U.S.C. 154(b) by 550 days.

(21) Appl. No.: 10/102,380

(22) Filed: Mar. 20, 2002

(65) Prior Publication Data

US 2002/0138001 A1   Sep. 26, 2002

(30) Foreign Application Priority Data

Mar. 22, 2001   (DE)   ............... 101 14 013

(51) Int. Cl.
*A61B 5/05*   (2006.01)
(52) U.S. Cl. .............. 600/410; 600/415; 600/421; 600/422; 324/307; 324/309; 324/318; 324/319; 324/322; 324/331
(58) Field of Classification Search ............... 5/601, 5/630, 906, 600; 600/407–423; 324/318, 324/307, 309, 331, 319, 322; 606/130; 378/193, 204, 208, 209; 250/522.1
See application file for complete search history.

(56) References Cited

U.S. PATENT DOCUMENTS

| | | | | |
|---|---|---|---|---|
| 4,391,352 A | * | 7/1983 | Brown ............... | 188/24.12 |
| 4,567,894 A | * | 2/1986 | Bergman ............ | 600/415 |
| 4,587,493 A | * | 5/1986 | Sepponen .......... | 324/319 |
| 4,694,836 A | * | 9/1987 | Buikman et al. ... | 600/410 |
| 4,891,596 A | | 1/1990 | Mitomi | |
| 4,926,760 A | * | 5/1990 | Sack ................... | 108/145 |
| 5,007,121 A | * | 4/1991 | McEathron ......... | 4/566.1 |
| 5,150,710 A | | 9/1992 | Hall et al. | |
| 5,427,116 A | * | 6/1995 | Noone ................ | 600/577 |
| 5,569,266 A | * | 10/1996 | Siczek ................ | 606/130 |
| 5,577,503 A | * | 11/1996 | Bonutti .............. | 600/415 |
| 6,011,396 A | * | 1/2000 | Eckels et al. ...... | 324/319 |
| 6,029,081 A | * | 2/2000 | DeMeester et al. | 600/410 |
| 6,240,582 B1 | * | 6/2001 | Reinke ............... | 5/601 |
| 6,275,722 B1 | * | 8/2001 | Martin et al. ...... | 600/410 |
| 6,317,619 B1 | * | 11/2001 | Boernert et al. ... | 600/410 |
| 6,345,193 B2 | * | 2/2002 | Dutto et al. ....... | 600/415 |
| 6,416,219 B1 | * | 7/2002 | Pflaum et al. ..... | 378/209 |
| 6,479,996 B1 | * | 11/2002 | Hoogeveen et al. | 324/307 |
| 6,529,004 B1 | * | 3/2003 | Young ................ | 324/318 |

(Continued)

FOREIGN PATENT DOCUMENTS

DE   OS 33 23 657   1/1984

(Continued)

OTHER PUBLICATIONS

"Bildgebende Systeme für die medizinische Diagnostik," 3rd Edition, Morneburg, Ed. (1995), pp. 501-503.

*Primary Examiner*—Brian L. Casler
*Assistant Examiner*—A. Lauritzen
(74) *Attorney, Agent, or Firm*—Schiff Hardin LLP

(57) ABSTRACT

In a magnetic resonance apparatus, the transmission coil for generating the radiofrequency excitation field is stationarily arranged. The geometry of the transmission coil is permanently prescribed. For acquiring the magnetic resonance signal, the reception arrangement includes at least one first local coil. This is secured to a movable carrier, so that it can be placed against the person from a remote position. The carrier is secured in a carrier mount arranged stationarily within the examination volume.

20 Claims, 4 Drawing Sheets

U.S. PATENT DOCUMENTS

| | | | |
|---|---|---|---|
| 6,591,128 B1 * | 7/2003 | Wu et al. | 600/422 |
| 6,637,056 B1 * | 10/2003 | Tybinkowski et al. | 5/611 |
| 6,661,227 B2 * | 12/2003 | Eggers et al. | 324/307 |
| 6,665,554 B1 * | 12/2003 | Charles et al. | 600/427 |
| 6,919,723 B2 * | 7/2005 | Davis | 327/318 |
| 6,946,836 B2 * | 9/2005 | Kuhara | 324/307 |
| 6,973,162 B2 * | 12/2005 | Block et al. | 378/63 |
| 6,973,689 B2 * | 12/2005 | Lenting et al. | 5/601 |
| 2003/0204136 A1 * | 10/2003 | Green et al. | 600/415 |
| 2005/0122108 A1 * | 6/2005 | Yasuhara et al. | 324/318 |
| 2006/0106302 A1 * | 5/2006 | Takamori | 600/415 |

FOREIGN PATENT DOCUMENTS

| | | |
|---|---|---|
| DE | OS 36 38 035 | 2/1988 |
| DE | 94 07 862 | 10/1995 |

* cited by examiner

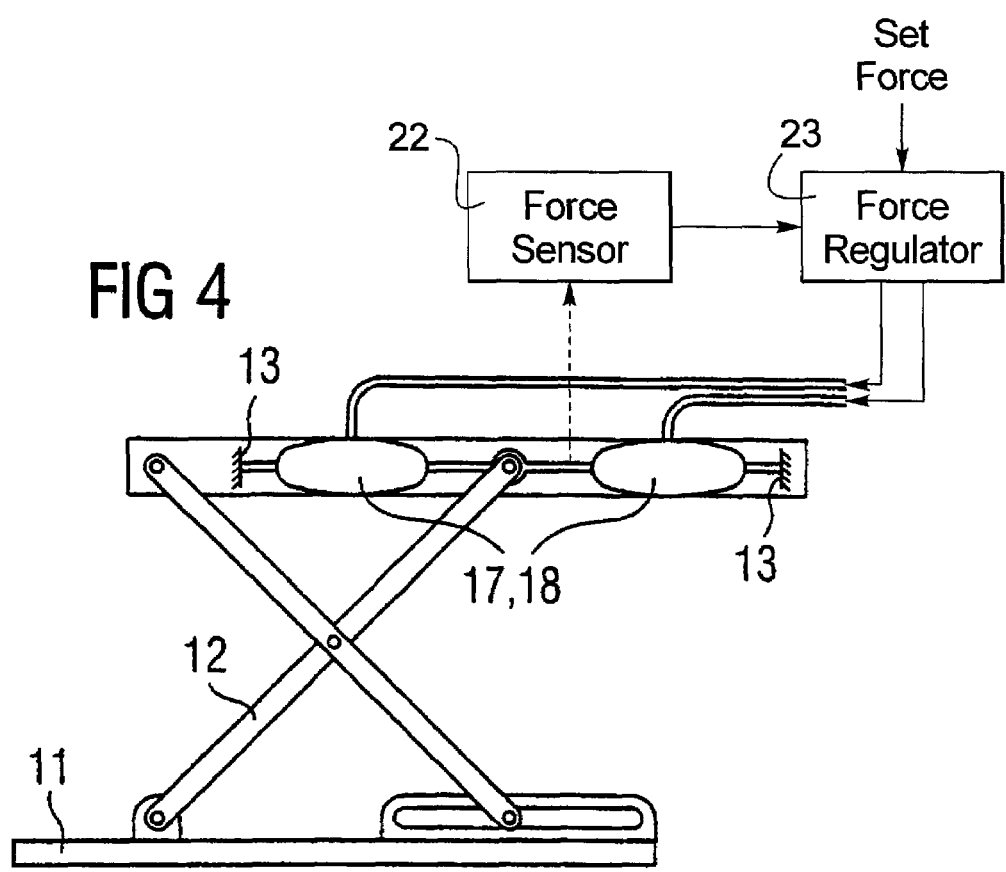
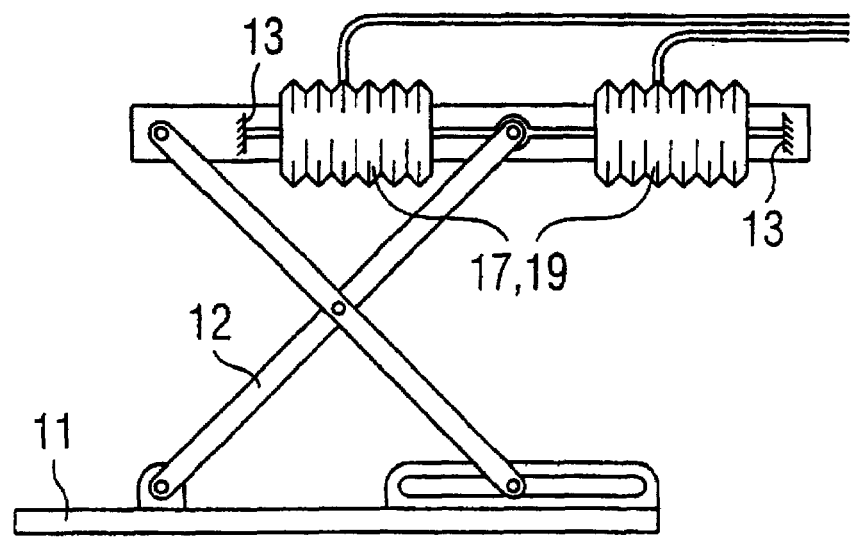

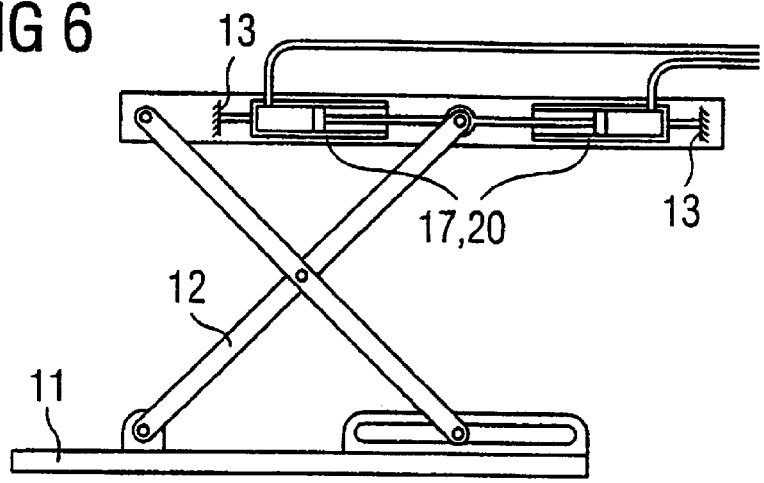
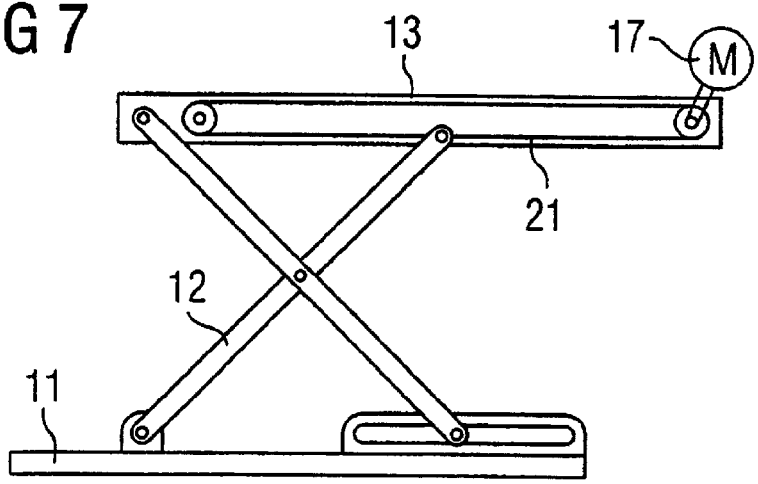
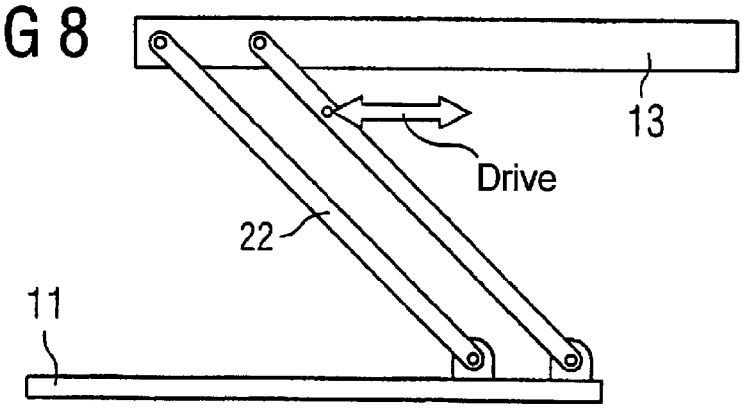

MAGNETIC RESONANCE APPARATUS

BACKGROUND OF THE INVENTION

1. Field of the Invention

The present invention is directed to a magnetic resonance apparatus of the type having an examination volume for the acceptance of a human to be examined with the magnetic resonance apparatus, magnet systems for generating a basic magnetic field and gradient fields, a transmission arrangement with at least one transmission coil for generating a radiofrequency excitation field and a reception arrangement for acquiring a magnetic resonance signal, the reception arrangement having at least one first local coil.

2. Description of the Prior Art

Magnetic resonance apparatuses are well known as described, for example, in the textbook, "Bildgebende System für die medizinische Diagnostik", 3rd Edition, 1995, Publicis MCD Verlag, pages 501 through 503.

German OS 33 23 657 discloses a magnetic resonance apparatus having an examination volume for the acceptance of a human to be examined with the magnetic resonance apparatus, magnet systems for generating a basic magnetic field and gradient fields, as well as a transmission/reception arrangement having a transmission/reception coil for generating a radio-frequency excitation field and for acquiring a magnetic resonance signal, wherein the coil geometry can be set and the coil can be moved toward the human from a remote position.

In medical magnetic resonance examinations of a human, the reception coil for the magnetic resonance echoes should be positioned as closely as possible to the patient in order to assure an optimum signal-to-noise ratio. Dependent on the type of examination and the body region examined, different reception coils adapted to the objective are required for this purpose. Coils referred to as local coils are employed for the reception, these being placed onto the person, or being applied to the person. So that the position of the local coils is unambiguous, the local coils are even partially fixed to the person. In practice, relatively large parts of the person are thereby covered by such local coils. This impedes the application of other examination elements (for example electrodes for ECG and the like). Additionally, many patients feel themselves constricted as a result of such coverage. In an extreme case, this can lead to the fact that the patients refuse the examination.

SUMMARY OF THE INVENTION

An object of the present invention is to provide a magnetic resonance apparatus wherein, with high measurement quality, applications of local coils are possible without impeding the application of further examination elements and while constricting the person as little as possible.

This object is achieved in an apparatus wherein the transmission coil is stationarily arranged, the geometry of the transmission coil is permanently prescribed, and a local coil is secured to a movable carrier, so that the local coil can be placed against the person proceeding from a remote position, and wherein the carrier is arranged at a carrier mount stationarily arranged within the examination volume.

As a result of the stationary arrangement of the transmission coil and the non-variable geometry of the transmission coil, an extremely uniform radio-frequency field can be achieved. Due to the employment of a local coil, a high signal-to-noise ratio can be achieved. Due to the fact that the local coil can be remotely kept in place, other examination elements can be attached to the person to be examined, and the person feels only slightly constricted.

By permanently prescribing the geometry of the local coil, an even better measured signal derives.

By connecting the carrier to a restoring spring with which a restoring force is applied to the carrier, this restoring force being directed away from the person, the local coil can be easily re-positioned.

When the restoring force is greater then the force of gravity of the carrier, an automatic return of the local coil ensues when the carrier is released from its position against the person.

When the carrier, when transferred into the remote position, interacts with a speed damper and/or an impact reducing arrangement, a gentle return of the local coil into the remote position ensues.

When the carrier can be placed against the person with limited force, particularly a regulated force, a gentle application to the person ensues.

The carrier can, for example be placed against the person by a scissors mechanism and/or by a leg mechanism. In the latter instance, the mechanism can, in particular, be fashioned as a parallelogram articulation.

It is possible to manually place the carrier against the person. Preferably, however, the carrier can be placed against the person with a drive. The drive, for example, can be fashioned as a fluid drive, for example as a fluid muscle, fluid bellows or fluid cylinder. It is likewise possible for the drive to be arranged at a distance from the carrier and to act on the carrier via force transmission arrangement, for example a threaded rod, a cable pull or a thrust rod.

When at least one further local coil is arranged fixed to the support at a patient support, preferably under the person, local coils can be placed under the person under examination in a simple way.

When the initially described local coil and, if present, also the further local coil are considerably smaller then the transmission coil, an even better signal-to-noise ratio derives.

DESCRIPTION OF THE DRAWINGS

FIGS. 2-8 respectively illustrate various local coils with carriers in accordance with the invention.

DESCRIPTION OF THE DRAWINGS

Figure 1:
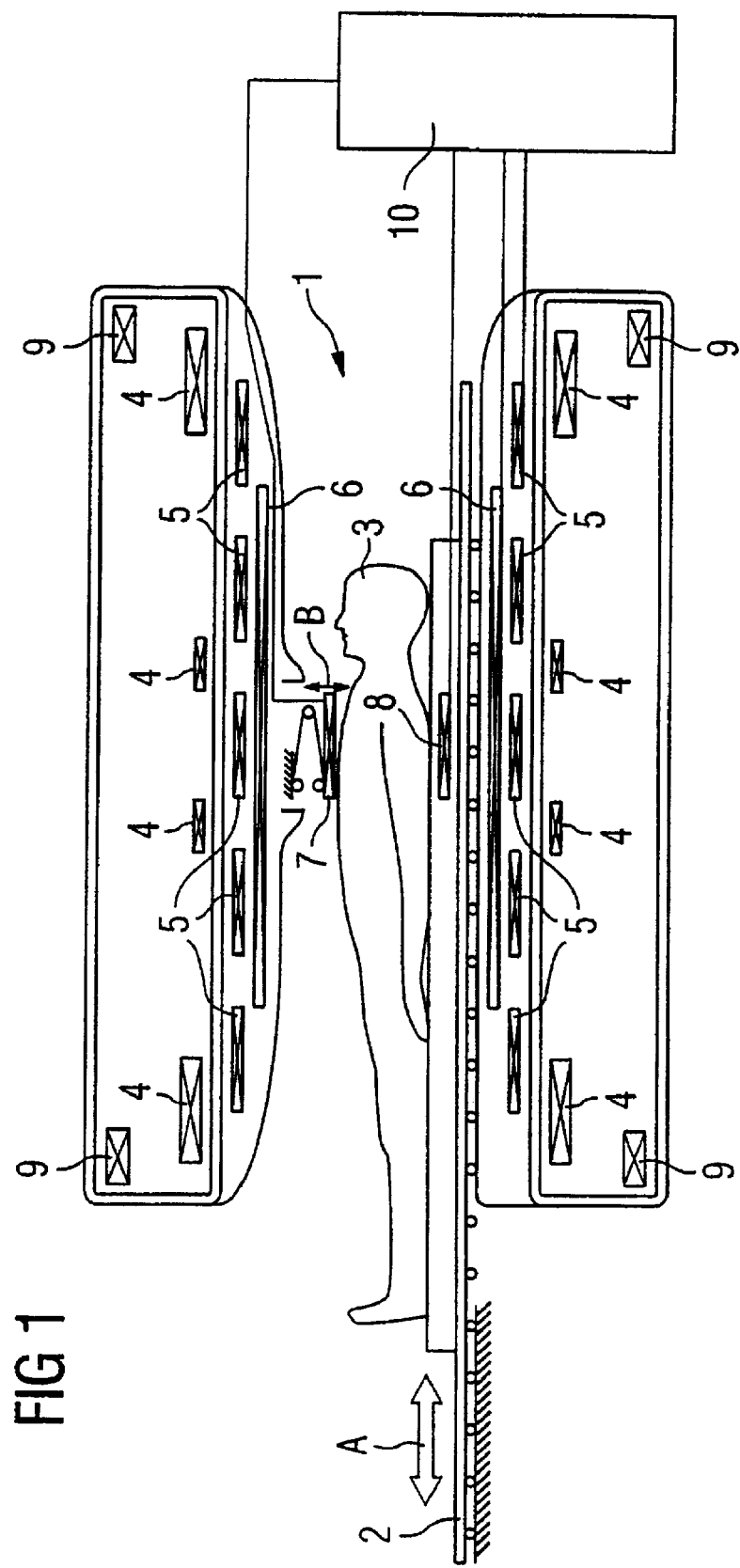
FIG. 1 is a schematic illustration of a magnetic resonance apparatus in accordance with the invention.

As shown in FIG. 1, a magnetic resonance apparatus has an examination volume 1. A person 3 to be examined can be moved into the examination volume 1 with a patient support 2. This is indicated in FIG. 1 by a double arrow A.

The person 3 therein is situated within a basic magnetic field that is generated by a basic magnet 4. To this end, a basic current flow in the basic magnet 4. A shielding current also flows in a shielding magnet 9.

Gradient fields that are generated by a gradient magnet system 5 are superimposed on the basic magnetic field. A transmission arrangement has a transmission coil 6 and a reception arrangement formed by a first local coil 7 and a second local coil 8. A radio-frequency excitation field can be generated with the transmission coil 6 and magnetic resonance signals can be acquired with the local coils 7, 8. An evaluation is then possible on the basis of the acquired magnetic resonance signals.

The gradient magnet system 5 as well as the coils 6 through 8 are connected to a control computer 10. The control computer 10 controls the gradient magnet system 5 and the transmission coil 6. Further, it reads magnetic resonance signals acquired from the local coils 7, 8 in and evaluates them.

The transmission coil 6 is stationarily mounted according to FIG. 1. The first local coil 7—as discussed in greater detail below in conjunction with FIGS. 2 through 8—is secured to a movable carrier 11 in the examination volume 1. As a result thereof, the first local coil 7 can be placed against the person 3 from a remote position. This is indicated in FIG. 1 by a double arrow B. The second local coil 8 is arranged at the patient support 2 fixed to the support or is placed thereon. As can be seen, it is arranged under the person 3. The geometry of the coils 6 through 8 is preferably permanently prescribed. The geometry of the second local coil 8, however, can be potentially flexible, so that it can adapt to the anatomy of the person 3.

FIG. 1 shows one first local coil 7 and one second local coil 8. In practice, however, many such local coils 7, 8 are present. The signals acquired by the local coils 7, 8 are individually selectable and interpretable by the control computer 10. Because they are usually provided in large numbers, the local coils 7, 8 are also considerably smaller than the transmission coil 6.

Figure 2:
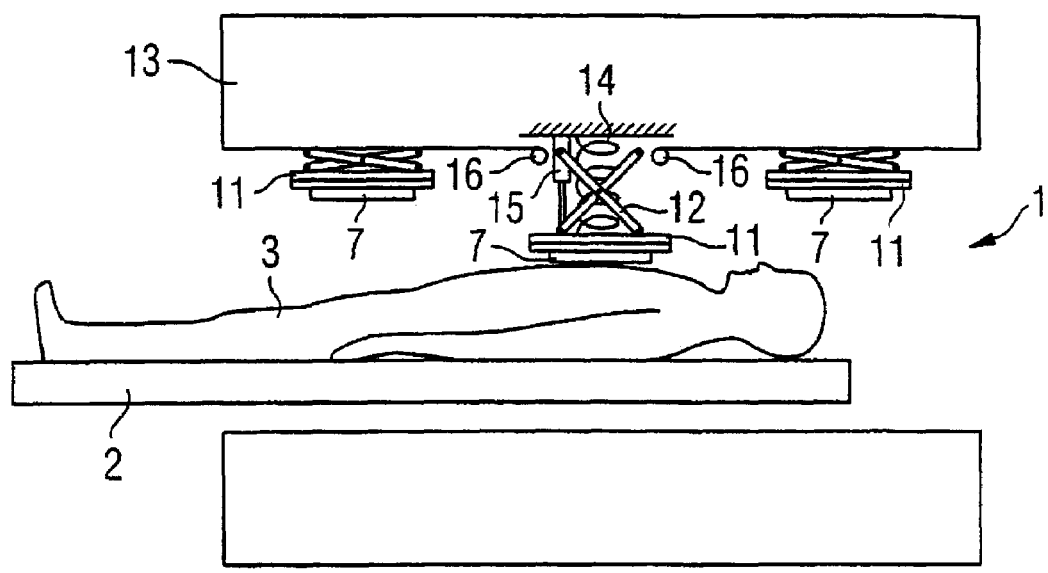
Figure 3:
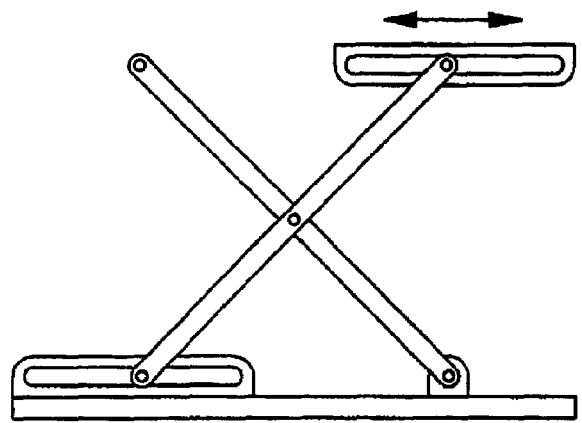

FIGS. 2 and 3 schematically show the carrier 11 that has already been mentioned, the first local coil 7 being secured thereto. According to FIG. 2, the carrier 11 can be placed against the person 3 from above via a scissors mechanism 12. It can also be seen from FIG. 2 that a number of carriers 11 are present, these being able to be placed against the person 3 individually and independently of one another. The two outer carriers 11 are shown in their remote position. It can also be seen from FIG. 2 that the carriers 11 are secured to a carrier mount 13 stationarily arranged within the examination space 1.

As shown in FIG. 2, the carrier 11 is connected to a restoring spring 14. This exerts a restoring force on the carrier 11 that is directed away from the person 3. Preferably, the restoring force is greater than the weight of the carrier 11. As a result of a simple release, for example a latch mechanism, a return of the carrier 11 into its remote position can then be achieved. For gentle handling of the local coil 7, the carrier 11 preferably interacts with a speed damper 15 (for example, an oil shock absorber) and/or impact buffers 16.

The carrier 11 can be fundamentally fashioned without a drive. Preferably, however, it can be placed against the person 3 by means of a drive 17 and can be returned into its remote position therewith. Placement against the person 3 preferably ensues in a force-regulated manner and thus force-limited as well.

The drive 17, for example, according to FIG. 4, can be fashioned as an arrangement known as a fluid muscle 18. Alternatively, the drive 17 according to FIGS. 5 and 6 can also be fashioned as a fluid bellows 19 or as a fluid cylinder 20. As shown in FIG. 4, the force used to place the carrier 11 against the patient can be regulated and/or limited by the use of a force sensor 23 which measures the actual force with which the carrier 11 is moved, and a force regulator 24 which modifies a set force, as needed, dependent on the measured actual force. This arrangement can be used in the other embodiments as well.

According to FIG. 7, it is also possible for the drive 17 to be arranged remote from the carrier 11 and to act on the carrier 11 via a force transmission arrangement 21 (according to FIG. 7, a cable pull 21). However, other force transmission arrangements 21 are possible, for example a threaded rod or a thrust rod.

Scissors mechanisms 12 have been utilized throughout in FIGS. 2 through 7. This, however, is not compulsory. According to FIG. 8, for example, it is also possible to place the carrier 11 against the person 3 via a leg mechanism 22. The leg mechanism 22 can be fashioned as a parallelogram articulation 22 according to FIG. 8.

According to FIGS. 2 through 8, the carrier 11 is stationarily secured to the carrier mount 13 within the examination volume 1.

As a result of the inventive fashioning of the magnetic resonance apparatus, no local coil 7 or 8 need be placed on the person 3 and be fixed to the person 7. The person 3 can even be moved into the examination volume without first local coil 7. Further, it is also possible to place the first local coil 7 against the patient 3 only for the respective measuring time and to immediately return them into the remote position after the examination has been ended. The psychological inhibition factor for magnetic resonance examination is therefore substantially lowered.

As warranted, it is even possible to move the person 3 through the examination volume 1 step-by-step and to successively apply a first local coil 7 to various body parts of the person 3.

Although modifications and changes may be suggested by those skilled in the art, it is in the intention of the inventor to embody within the patent warranted hereon all changes and modifications as reasonably and properly come within the scope of his contribution to the art.

I claim as my invention:

1. A magnetic resonance apparatus comprising:

an apparatus housing;

a basic magnetic field system which generates a static basic magnetic field in an imaging volume encompassed by said apparatus housing;

a gradient field system which generates gradient fields in said examination volume;

a radio frequency system having a transmission coil which emits a radio frequency excitation field in said examination volume, configured to trigger nuclear magnetic resonance signals in a subject in said examination volume, and a reception coil arrangement, comprising a local coil, configured to receive said nuclear magnetic resonance signals, said transmission coil having a non-variable geometry;

a moveable carrier to which said local coil is attached, and a carrier mount, stationarily and permanently disposed within said examination volume, to which said moveable carrier is mounted, said moveable carrier being moveable from a remote position to a deployed position that causes said local coil to be placed against a subject in said examination volume;

a restoring spring connected between said moveable carrier and said carrier mount that exerts a restoring force on said moveable carrier mount urging said carrier and said local coil towards said remote position, said restoring force exerted by said restoring spring being greater than a weight of said moveable carrier;

a releasable holder that acts on said movable carrier to hold said local coil in said deployed position and, when released, allows said spring to automatically restore said local coil to said remote position; and an actuatable drive connected to said moveable carrier that, when actuated, applies a force to said movable carrier that is greater than said restoring force to move said carrier between said remote position and said deployed position against said subject.

2. A magnetic resonance imaging apparatus as claimed in claim 1 wherein said local coil has a non-variable geometry.

3. A magnetic resonance imaging apparatus as claimed in claim 1 further comprising a speed damper disposed to interact with said moveable carrier when said moveable carrier is moved to said remote position.

4. A magnetic resonance imaging apparatus as claimed in claim 1 further comprising a impact absorber disposed to interact with said moveable carrier when said moveable carrier is moved to said remote position.

5. A magnetic resonance imaging apparatus as claimed in claim 1 wherein said drive has a force limiter which limits a force with which said local coil can be placed against said subject in said deployed position.

6. A magnetic resonance imaging apparatus as claimed in claim 1 wherein said drive has a force regulator which regulates a force with which said local coil can be placed against said subject in said deployed position.

7. A magnetic resonance imaging apparatus as claimed in claim 1 further comprising a scissors mechanism which connects said moveable carrier to said carrier mount, allowing said carrier to move between said remote position and said deployed position.

8. A magnetic resonance imaging apparatus as claimed in claim 1 further comprising a leg mechanism which connects said moveable carrier to said carrier mount, allowing said carrier to move between said remote position and said deployed position.

9. A magnetic resonance imaging apparatus as claimed in claim 8 wherein said leg mechanism is a parallelogram articulation.

10. A magnetic resonance imaging apparatus as claimed in claim 8 wherein said drive is a fluid drive.

11. A magnetic resonance imaging apparatus as claimed in claim 1 wherein said drive is disposed remote from said moveable carrier, and further comprising a force transmitter connected between said drive and said moveable carrier.

12. A magnetic resonance imaging apparatus as claimed in claim 11 wherein said force transmitter is selected from the group consisting of a threaded rod, a cable pull and a thrust rod.

13. A magnetic resonance imaging apparatus as claimed in claim 1 wherein said local coil is a first local coil, and wherein said apparatus further comprises a patient support, adapted to receive said subject thereon, and wherein said reception arrangement comprises a second local coil fixed to said patient support.

14. A magnetic resonance imaging apparatus as claimed in claim 13 wherein said second local coil is fixed to said patient support at a location adapted to be beneath said subject on said patient support.

15. A magnetic resonance imaging apparatus as claimed in claim 13 wherein said second local coil is smaller then said transmission coil.

16. A magnetic resonance imaging apparatus as claimed in claim 1 wherein said local coil is smaller than said transmission coil.

17. A magnetic resonance imaging apparatus as claimed in claim 1 wherein said carrier mount is disposed in said apparatus housing so that said local coil is disposed above said subject in said examination volume.

18. A magnetic resonance imaging apparatus as claimed in claim 10, wherein said fluid drive is selected from the group consisting of a fluid muscle, a fluid bellows and a fluid cylinder.

19. A magnetic resonance imaging apparatus as claimed in claim 13, wherein said patient support is moveable relative to said imaging volume.

20. A magnetic resonance imaging apparatus as claimed in claim 1, wherein said carrier mount is attached to said apparatus housing.

* * * * *